US 6,687,122 B2

(12) United States Patent
Monfarad (10) Patent No.: US 6,687,122 B2
(45) Date of Patent: Feb. 3, 2004

(54) MULTIPLE COMPRESSOR REFRIGERATION HEAT SINK MODULE FOR COOLING ELECTRONIC COMPONENTS

(75) Inventor: Ali Heydari Monfarad, Albany, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/206,570

(22) Filed: Jul. 26, 2002

(65) Prior Publication Data

US 2003/0043542 A1 Mar. 6, 2003

Related U.S. Application Data

(60) Provisional application No. 60/316,626, filed on Aug. 30, 2001.

(51) Int. Cl.$^7$ ................................................. H05K 7/20
(52) U.S. Cl. .................. 361/687; 361/695; 165/104.21; 62/259.2
(58) Field of Search ................................. 361/679–687, 361/695–722, 735, 752; 165/803–804, 104.21–104.22, 104.33, 164–167; 62/233, 259.2, 238.6, 175, 199

(56) References Cited

U.S. PATENT DOCUMENTS

| 4,313,310 A | 2/1982 | Kobayashi et al. ........... 62/175 |
| 4,434,625 A | 3/1984 | Cree ........................... 62/199 |
| 4,846,861 A | 7/1989 | Berry et al. ................... 62/6 |
| 4,984,432 A * | 1/1991 | Corey ........................... 62/87 |
| 5,365,749 A | 11/1994 | Porter ........................ 62/259.2 |
| 5,693,991 A | 12/1997 | Hiterer et al. ................. 310/30 |
| 5,715,693 A | 2/1998 | Van der Walt et al. ....... 62/198 |
| 5,884,692 A | 3/1999 | Lee et al. ................... 165/80.3 |
| 5,963,425 A | 10/1999 | Chrysler et al. ............. 361/695 |
| 5,993,178 A | 11/1999 | Park et al. .................... 417/545 |
| 6,034,872 A | 3/2000 | Chrysler et al. ............. 361/699 |
| 6,035,655 A | 3/2000 | Hare et al. .................. 62/259.2 |
| 6,038,874 A | 3/2000 | van der Walt et al. ........ 62/198 |
| 6,044,660 A | 4/2000 | Numoto et al. ................ 62/468 |
| 6,054,676 A | 4/2000 | Wall et al. ................... 219/209 |
| 6,079,960 A | 6/2000 | Funatsu et al. ............. 417/488 |
| 6,089,836 A | 7/2000 | Seo ............................. 417/417 |
| 6,138,459 A | 10/2000 | Yatsuzuka et al. ............... 62/6 |
| 6,250,895 B1 | 6/2001 | Kawahara et al. .......... 417/363 |
| 6,398,523 B1 | 6/2002 | Hur et al. .................... 417/417 |
| 6,601,397 B2 * | 8/2003 | Pham et al. .................. 62/181 |

* cited by examiner

Primary Examiner—Hung Van Duong
(74) Attorney, Agent, or Firm—Gunnison, McKay & Hodgson, L.L.P.; Philip J. McKay (57) ABSTRACT

A multiple compressor refrigeration heat sink module is suitable for use in standard electronic component environments. The multiple compressor refrigeration heat sink module is self-contained and is specifically designed to have physical dimensions similar to those of a standard air-based cooling system. As a result, the multiple compressor refrigeration heat sink module can be utilized in existing electronic systems without the need for significant system housing modification or the "plumbing" associated with prior art liquid-based cooling systems. The multiple compressor refrigeration heat sink module is also well suited for applications that require a highly reliable, energy and space efficient, cooling systems for electronic components such as multi-chip modules and mainframe computer applications.

41 Claims, 8 Drawing Sheets

MULTIPLE COMPRESSOR REFRIGERATION HEAT SINK MODULE FOR COOLING ELECTRONIC COMPONENTS

RELATED APPLICATIONS

This application claims the benefit of U.S. Provisional Application No. 60/316,626 filed Aug. 30, 2001, entitled "Refrigeration System for Electrical Components" and naming Ali Heydari and Eric Olsson as inventors, which is incorporated herein by reference in its entirety.

FIELD OF THE INVENTION

The present invention relates to a refrigeration system for cooling electrical components. More particularly, the invention relates to a multiple compressor refrigeration heat sink module that is suitable for use in standard electronic component environments.

BACKGROUND OF THE INVENTION

Electronic components, such as microprocessors and other various integrated circuits, have advanced in at least two significant ways. First, feature sizes have moved into the sub-micron range thereby allowing larger numbers of transistors to be formed on a given surface area. This in turn has resulted in greater device and circuit density on the individual chips. Second, in part due to the first advance discussed above, microprocessors have increased dramatically in clock speed. At present microprocessor speeds of 2.5 Gigahertz are coming to market and the 3 and 4 Gigahertz range is rapidly being approached.

As a result of the advances in device density and microprocessor speed discussed above, heat dissipation, which has always been a problem in the past, is rapidly becoming the limiting factor in microprocessor performance. Consequently, heat dissipation and cooling is now the foremost concern and the major obstacle faced by system designers.

As noted, heat dissipation has long been recognized as a serious problem limiting the performance of electronic components and systems. In the past, the solutions to the heat dissipation problem have been mostly limited to air-based cooling systems, with only the most exotic military, scientific and custom electronic systems employing the bulky and costly prior art liquid-based cooling solutions.

In the prior art, air-based cooling systems, such as heat sinks, cooling fins, heat pipes and fans, have been the systems of choice for several reasons. First, the air-based cooling systems of the prior art were modular and self-contained and were therefore field replaceable with minimal effort using standard tools. Second, the prior art air-based cooling systems attached directly to the components that needed cooling and a discrete cooling unit could be provided for each heat source. In addition, air-based cooling systems were compact and simple in both operation and installation, with minimal parts to fail or break and minimal added system complexity. Therefore, prior art air-based cooling systems were very reliable. In addition, and probably most importantly, in the prior art, air-based cooling systems could reasonably meet the cooling needs of electronic devices and systems so there was little motivation to move to the more complex and problematic liquid-based systems. However, as noted above, due to the advances in microprocessor speeds and device density, air-based cooling systems will most likely not be a viable option for electronic device cooling for the next generation of microprocessors.

As noted above, another possible prior art cooling system that could potentially provide the level of cooling required by the next generation of microprocessors is liquid-based cooling systems. Prior art liquid-based cooling systems typically used a refrigerant, such as R134, that was circulated by a compressor. In prior art liquid-based cooling systems the compressor was typically a crankshaft reciprocating compressor or a rotary compressor similar to those used in home refrigerators.

As noted above, prior art liquid-based cooling systems have far more potential cooling capability than air-based systems. However, in the prior art liquid-based cooling systems, the crankshaft reciprocating or rotary compressors were typically, by electronics industry standards, very large, on the order of tens of inches in diameter, very heavy, on the order of pounds, and often required more power to operate than the entire electronic system they would be charged with cooling. In addition, the size and design of prior art liquid-based cooling systems often required that the major components of the prior art liquid-based cooling system be centrally located, typically remote from the electronic devices to be cooled, and that a complicated system of tubing or "plumbing" be used to bring the cooling liquid into thermal contact with the heat source, i.e., with the microprocessor, multi-chip module, or other integrated circuit. Consequently, unlike prior art air-based cooling systems, prior art liquid-based cooling systems were not modular, were not self-contained, and often required special expertise and tools for maintenance and operation. In addition, unlike the prior art air-based cooling systems discussed above, prior art liquid-based cooling systems did not attach directly to the components that needed cooling and a discrete cooling unit typically could not be provided for each heat source. Also, unlike the prior art air-based cooling systems discussed above, prior art liquid-based cooling systems were not compact and were not simple in either operation or installation. Indeed, prior art liquid-based cooling systems typically included numerous parts which could potentially fail or break. This added complexity, and threat of component failure, was particularly problematic with respect to the associated plumbing discussed above because a failure of any of the tubes could result in the introduction of liquid refrigerant into, or onto, the electronic devices and could cause catastrophic system failure.

In addition, prior art liquid-based cooling systems employed compressors that typically were highly orientation dependent, i.e., they could not operate at angles of more than 30 or 40 degrees. Consequently, prior art liquid based cooling systems were particularly ill suited for the electronics industry that stresses flexibility and often requires orientation independent operation.

In addition, prior art liquid-based cooling systems used large amounts of oil for compressor operation. This represented minimal problems in most refrigeration uses, however, in the electronics industry, the use of oil is problematic in terms of system operation, maintenance, potential leaks and weight.

Given that, as discussed above, air-based cooling systems have reached their operational limits when it comes to cooling electronic components, there is a growing realization that some other form of cooling system, such as liquid-based cooling systems will need to be adopted by the electronics industry. However, as discussed above, prior art liquid-based cooling systems are far from ideal and, thus far, the industry has not adopted liquid-based cooling in any meaningful way because the problems associated with prior art liquid-based cooling systems are still thought to outweigh the advantages these systems provide in terms of increased cooling capacity.

What is needed is a cooling system that has the cooling capacity of a liquid-based cooling system yet has the advantages of being modular, simple, and compact and highly reliable like air-based cooling systems.

SUMMARY OF THE INVENTION

The present invention is directed to a multiple compressor refrigeration heat sink module that is suitable for use in standard electronic component environments. According to the present invention, advances in compressor technology are incorporated in a multiple compressor refrigeration heat sink module to be used for cooling electronic components.

The multiple compressor refrigeration heat sink module of the invention is self-contained and is specifically designed to have physical dimensions similar to those of a standard air-based cooling system. As a result, the present invention can be utilized in existing electronic systems without the need for significant system housing modification or the "plumbing" associated with prior art liquid-based cooling systems. Indeed, unlike prior art liquid-based cooling systems, in one embodiment of the invention, the various parts of the multiple compressor refrigeration heat sink module of the invention, including the very minimal tubing, are self-contained in the multiple compressor refrigeration heat sink module and therefore a failure of any of the tubes would typically not result in the introduction of liquid into, or onto, the electronic devices and would not cause catastrophic system failure, as was the risk with prior art liquid-based cooling systems.

The multiple compressor refrigeration heat sink module of the present invention is a modified liquid-based cooling system and therefore provides the cooling capacity of a prior art liquid-based cooling systems. However, unlike prior art liquid-based cooling systems, in one embodiment of the invention, the multiple compressor refrigeration heat sink module of the invention is modular and self-contained and is therefore field and/or customer replaceable with minimal effort using standard tools. In addition, unlike prior art liquid-based cooling system, the multiple compressor refrigeration heat sink module of the invention is capable of being attached directly to the components that need cooling and, in one embodiment of the invention, a discrete multiple compressor refrigeration heat sink module of the invention can be provided for each heat source. In addition, unlike prior art liquid-based cooling systems, the multiple compressor refrigeration heat sink module of the invention is compact and simple in both operation and installation, with minimal parts to fail or break and minimal added complexity. Therefore, unlike prior art liquid-based cooling systems, the multiple compressor refrigeration heat sink module of the invention is sturdy and reliable.

In addition, the multiple compressor refrigeration heat sink module of the present invention is specifically designed to be operational in any orientation. Consequently, unlike prior art liquid-based cooling systems, the multiple compressor refrigeration heat sink module of the present invention can be mounted, and operated, at any angle. This makes the multiple compressor refrigeration heat sink module of the present invention particularly well suited for use with electronic systems.

In addition, since the multiple compressor refrigeration heat sink modules of the invention include multiple compressors, they are ideal for use in applications, such as multi-chip module and mainframe applications, where more cooling capacity is required and/or a higher degree of system reliability and efficiency is necessary.

In addition, by employing multiple compressors, the multiple compressor refrigeration heat sink module of the invention can provide more cooling capacity without resorting to a larger single compressor. Consequently, multiple compressor refrigeration heat sink modules of the invention are more flexible in terms of the resulting module dimensions. Therefore, the multiple compressor refrigeration heat sink modules of the invention have a flexible, and smaller, footprint that more easily fit into smaller spaces and existing system housings. Thus, using the multiple compressor refrigeration heat sink modules of the invention, there is no need to design a system with the compressor removed from the heat source. This avoids the space and plumbing complications associated with remotely located compressors.

In addition, multiple compressors provide the multiple compressor refrigeration heat sink modules of the invention with component redundancy and a safety backup mechanism. This is particularly advantageous in systems, such as mainframe computers, where components, such as multi-chip modules, cannot be "hot-swapped" out and the entire system must be shut down in order to remove and/or replace the faulty module. By employing multiple compressors, the multiple compressor refrigeration heat sink modules of the invention provide a redundancy whereby if one compressor fails, the other compressor can be used to keep the "cold-swap" system safely up and running until a convenient time is found to shut down the entire "cold-swap" system to make repairs.

In one embodiment of the invention, one compressor is typically on and the other compressor is in standby. In this embodiment of the invention, a compressor control mechanism is typically a simple toggle switch that applies power to the operational "standby" compressor in the event of failure of the main compressor. In other embodiments of the invention, the multiple compressors time-share so that no one compressor is worn out faster than the other. In this embodiment of the invention, the compressor control mechanism is a simple toggle switch connected a timer circuit to apply power to the compressors on a time-sharing basis.

In addition, in one embodiment of the invention, multiple compressors provide the multiple compressor refrigeration heat sink modules of the invention with parallel operation capability. In this embodiment of the invention, the cooling load at any given time is shared between compressors. Load sharing is advantageous because it is typically easier on the compressors, since no single compressor is forced to carry the entire load.

In addition, parallel operation allows for variable cooling capability. In this embodiment of the invention, the compressor control mechanism works to increase the cooling capacity provided by compressors of the multiple compressor refrigeration heat sink modules of the invention in response to an increase in heat generated by the heat source. Consequently, the multiple compressor refrigeration heat sink modules of the invention have the capability to respond to an increase in microprocessor activity or ambient system temperature. This is a distinct improvement over single compressor systems that were designed to simply continuously run at a level that would provide cooling for a "worst-case" heat load, regardless of the actually heat load and the actual cooling required. Consequently, the multiple compressor refrigeration heat sink modules of the invention can provide adequate cooling, but avoid overcooling and the problems associated with overcooling such as condensation, excessive power use, and unnecessary component wear and tear.

In one embodiment of the invention, the variable cooling capability is accomplished by any one of several capacity control mechanisms well known in the art of standard refrigeration such as: a hot gas bypass mechanism; an evaporator driven pressure regulator mechanism; or a suction gas throttling mechanism. Hot gas bypass mechanisms, evaporator driven pressure regulator mechanisms, suction gas throttling mechanisms, and most other mechanical cooling capacity control schemes or mechanisms, have the advantage of increased reliability since these systems typically do not require electronics and have minimal, or no, moving parts to wear out or otherwise fail. Consequently, embodiments of the multiple compressor refrigeration heat sink modules of the invention using these mechanical cooling control schemes are particularly robust and low maintenance.

As a result of the features of the multiple compressor refrigeration heat sink modules of the present invention, discussed in more detail below, the multiple compressor refrigeration heat sink modules of the present invention can meet the cooling needs of multi-chip module and main frame systems, as well as other high heat producing systems, and can make further speed and device density improvements in microprocessor design a workable possibility.

BRIEF DESCRIPTION OF THE DRAWINGS

The refrigeration system of the present invention will be described in the following detailed description, with reference to the accompanying drawings. In the drawings, the same reference numbers are used to denote similar components in the various embodiments.

DETAILED DESCRIPTION

Figure 1:
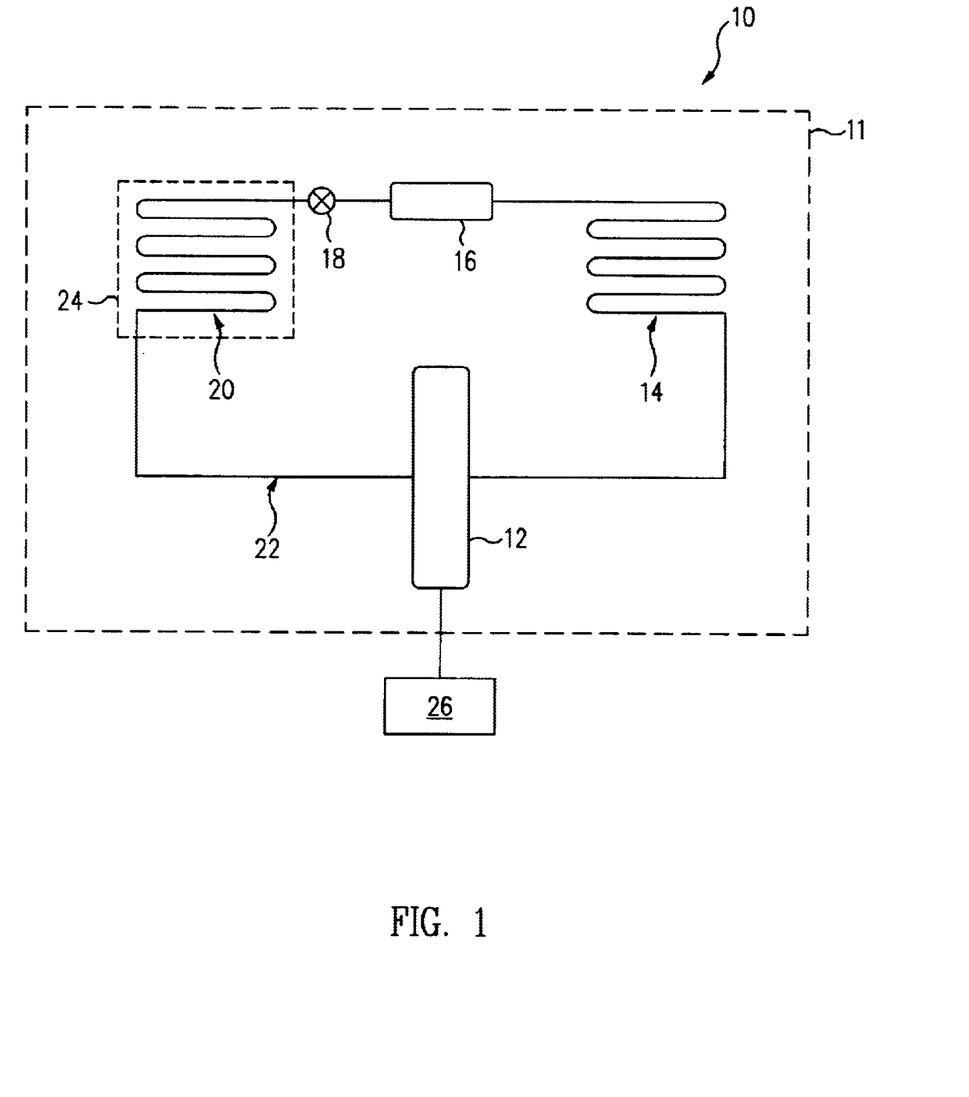
FIG. 1 is a functional diagram of a field replaceable packaged refrigeration heat sink module designed according to the principles of one embodiment of the invention.

FIG. 1 is a functional diagram of a field replaceable packaged refrigeration heat sink module 10 designed according to one embodiment of the invention. Referring to FIG. 1, field replaceable packaged refrigeration heat sink module 10 includes a compressor 12, a condenser 14, an optional receiver 16, an expansion device 18 and an evaporator 20, all of which are connected together in refrigeration loop 22 through which a refrigerant, such as R134, is circulated.

As also shown in FIG. 1, compressor 12, condenser 14, optional receiver 16, expansion device 18 and evaporator 20, in a refrigeration loop 22 are self-contained in field replaceable packaged refrigeration heat sink module 10, as indicated by dashed line 11.

In one embodiment of the invention, evaporator 20 is positioned in thermal contact with a heat source 24, such as an electronic component, that is to be cooled. As is well understood by those of ordinary skill in the art, compressor 12 compresses the refrigerant (not shown) into a high-pressure, high temperature liquid that is then conveyed to condenser 14. At condenser 14, the refrigerant is allowed to cool before being conveyed to receiver 16. From receiver 16, the refrigerant passes through expansion device 18, which may be, for example, a capillary tube, and into evaporator 20. The liquid refrigerant evaporates in evaporator 20 and in the process absorbs heat from heat source 24 to produce the desired cooling effect. From evaporator 20 the refrigerant is drawn back into compressor 12 to begin another cycle through refrigeration loop 22.

In accordance with the present invention, compressor 12 is one of several new generation compressors that are relatively small, on the order of 2.0 inches in diameter and 3 to 4 inches long. In one embodiment of the invention, compressor 12 is less than 1.7 inches in diameter and less than 4 inches long. One example of this new generation of compressors is the relatively new linear compressor now being used in the more standard refrigeration, i.e., non-electronics, industry but were virtually unknown in the electronic industry. In one embodiment of the invention, compressor 12 is a linear compressor whose operation is controlled by drive circuit 26.

Figure 2:
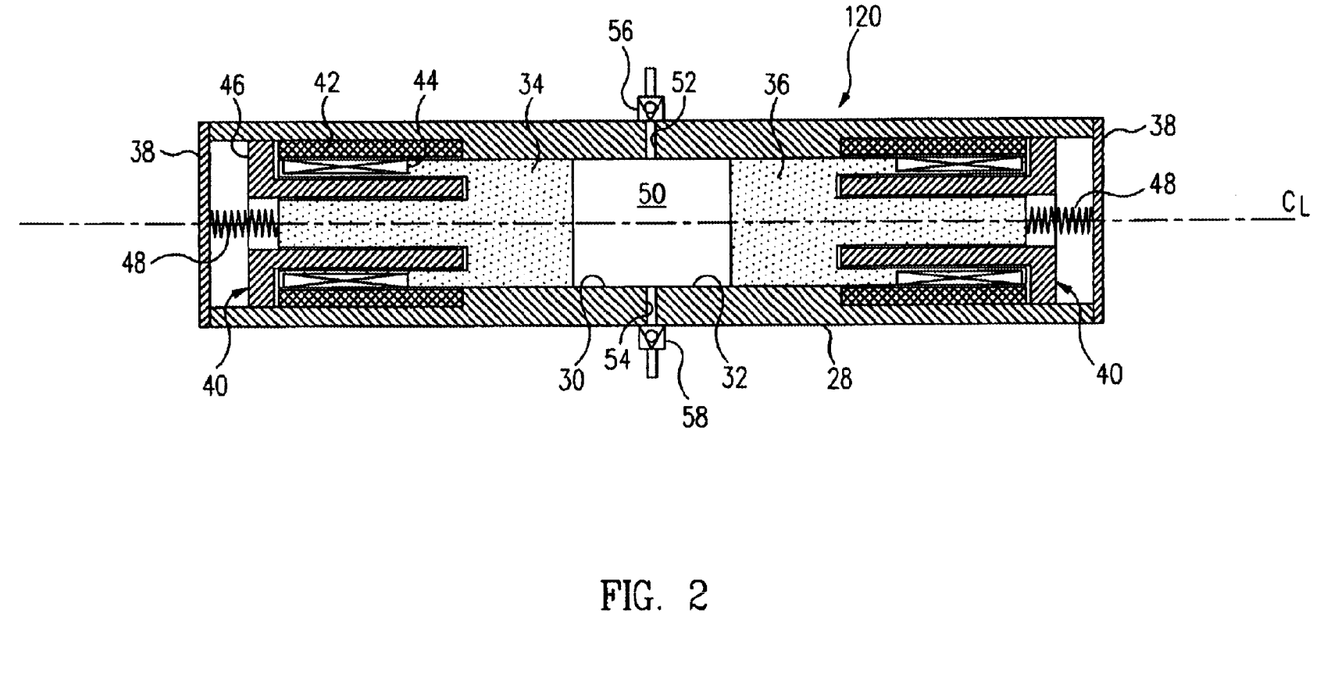
FIG. 2 is a longitudinal cross sectional view of an exemplary linear compressor that may be used in the field replaceable packaged refrigeration heat sink module depicted in FIG. 1 or the multiple compressor refrigeration heat sink module depicted in FIG. 6 according to the principles of one embodiment of the invention.

As discussed in more detail with respect to FIG. 2, a linear compressor is a positive displacement compressor having one or more free floating pistons that are driven directly by a linear motor. Thus, a linear compressor differs from a conventional reciprocating and rotary compressor where the pistons are driven through a crankshaft linkage, or by a rotary motor through a mechanical linkage, respectively. Since the capacity of any compressor is directly related to the size and displacement of the pistons, a linear compressor can typically be made smaller than a crankshaft reciprocating or rotary compressor but can maintain the same capacity since the displacement of the pistons is not dependent on the size of a mechanical linkage. In addition, since a linear compressor usually comprises fewer moving parts than a crankshaft reciprocating or rotary compressor, the linear compressor is typically quieter than a crankshaft reciprocating or rotary compressor. Furthermore, since the pistons of a double-piston linear compressor move in opposition to one another, the reaction forces of the pistons will cancel each other out and the vibrations that are commonly experienced with crankshaft reciprocating or rotary compressors will consequently be suppressed.

In addition, unlike prior art liquid-based cooling systems with compressors that used large amounts of oil for compressor operation, a linear compressor uses little or no oil in operation. This is a significant advantage since, as discussed above, in the electronics industry, the use of oil is problematic in terms of system operation, maintenance, potential leaks and weight.

Consequently, linear compressors offer many advantages over a crankshaft reciprocating compressor or a rotary compressor for application as compressor 12 in field replaceable packaged refrigeration heat sink module 10.

The linear compressors suitable for use as compressor 12 in field replaceable packaged refrigeration heat sink module 10 can be any of a variety of single, double or multiple-piston linear compressors that are known in the art. For example, in one embodiment of the invention, linear compressor 12 is a single-piston linear compressor of the type disclosed in U.S. Pat. No. 5,993,178, which is hereby incorporated herein by reference, or a double-piston linear compressor of the type disclosed in U.S. Pat. No. 6,089,836 or U.S. Pat. No. 6,398,523, both of which are hereby incorporated herein by reference.

Referring to FIG. 2, an exemplary linear compressor 120, suitable for use as compressor 12 in FIG. 1 or compressors 612A and/or 612B in FIGS. 6, 7, 8 and 9, comprises a housing 28, first and second cylinders 30, 32 which are connected to, or formed integrally with, housing 28, and first and second pistons 34, 36 which are slidably received within first and second cylinders 30, 32, respectively. The ends of housing 28 are, in one embodiment, hermetically sealed, such as by end plates 38. In addition, each cylinder 30, 32 has an axial centerline CL that is, in one embodiment, coaxial with that of the other cylinder. Furthermore, housing 28 is, in one embodiment, constructed of a magnetically permeable material, such as stainless steel, and pistons 34, 36 are optimally constructed of a magnetically indifferent material, such as plastic or ceramic.

In the embodiment of exemplary linear compressor 120 shown in FIG. 2, each piston 34, 36 is driven within its respective cylinder 30, 32 by linear motor 40. Each motor 40 includes a ring-shaped permanent magnet 42 and an associated electrical coil 44. In the embodiment of an exemplary linear compressor 120 shown in FIG. 2, magnet 42 is mounted within housing 28 and coil 44 is wound upon a portion of piston 34, 36. In one embodiment, magnet 42 is radially charged, and each motor 40 includes a cylindrical core 46 mounted within housing 28 adjacent magnet 42 to direct the flux lines (not shown) from magnet 42 across coil 44. In one embodiment, coil 44 is energized by an AC current, from drive circuit 26 (FIG. 1), over a corresponding lead wire (not shown). In one embodiment of the invention, drive circuit 26 is programmed such that, when the AC current is applied to coils 44 (FIG. 2), pistons 34, 36 will reciprocate toward and away from each other along the axial centerline CL of cylinders 30, 32. In another embodiment, DC current is applied. In one embodiment, spring 48, or similar means, may be connected between each piston 34, 36 and adjacent end plate 38 to aid in matching the natural frequency of piston 34, 36 to the frequency of the current from drive circuit 26 (FIG. 1).

The embodiment of an exemplary linear compressor 120 shown in FIG. 2 also includes a compression chamber 50 located within cylinders 30, 32, between pistons 34, 36. During the expansion portion of each operating cycle of linear compressor 120, motors 40 will move pistons 34, 36 away from each other. This will cause the then gaseous refrigerant within evaporator 20 (FIG. 1) to be drawn into compression chamber 50 (FIG. 2), through an inlet port 52 in housing 28. During the successive compression portion of the operating cycle of exemplary linear compressor 120, motors 40 will move pistons 34, 36 toward each other. Pistons 34, 36 will consequently compress the then gaseous refrigerant within compression chamber 50 into a liquid and eject it into condenser 14 (FIG. 1), through an outlet port 54 (FIG. 2) in housing 28. In one embodiment, suitable check valves 56, 58 are provided in inlet and outlet ports 52, 54, respectively, to control the flow of refrigerant through inlet and outlet ports 52, 54 during the expansion and compression portions of each operating cycle.

While a specific embodiment of a field replaceable packaged refrigeration heat sink module 10 is discussed above that includes exemplary linear compressor 120, those of skill in the art will recognize that the choice of a linear compressor, or any particular compressor, for use as compressor 12 in the discussion above was made for illustration simplicity and to avoid detracting from the invention by describing multiple specific embodiments at one time. In other embodiments of the invention appropriately sized rotary compressor, or other type of compressor, can be used as compressor 12. For instance, in various embodiments of the invention, compressor 12 can be: a reciprocating compressor; a swash-plate compressor; a rolling piston compressor; a scroll compressor; a rotary vane compressor; a screw compressor; an aerodynamic-turbo compressor; an aerodynamic-axial compressor; or any other reciprocating, volumetric or aerodynamic compressor known in the art, or developed after this application is filed. Consequently, the present invention should not be read as being limited to the particular embodiments discussed above using linear, or any specific, compressor types.

According to the principles of the invention, field replaceable packaged refrigeration heat sink module 10 can be readily adapted for use in cooling one or more integrated circuits that are mounted on a single circuit board and are part of a larger electronic system. For example, in many computer servers a number of integrated circuits are mounted on a single circuit board that, in turn, is housed within an enclosure/cabinet or "rack unit", and a number of such rack units are, in turn, mounted in corresponding racks that are supported in the housing of the server.

In accordance with one industry standard, each rack unit has a height of only 1.75 inches. This fact makes use of prior art liquid-based cooling systems extremely difficult, if not impossible, and makes the extensive, and potentially disastrous, plumbing, discussed above, a system requirement. In contrast, a single, or even multiple, field replaceable packaged refrigeration heat sink modules 10, designed according to the principles of the invention, can be positioned within the housing of the server, and/or on the rack units, to directly cool the integrated circuits that are located within or on the rack units. Consequently, in one embodiment of the invention, field replaceable packaged refrigeration heat sink modules 10, designed according to the invention, are housed within a small scale cooling unit that can be located within each rack unit and connected directly to cool each integrated circuit as needed.

Figure 3:
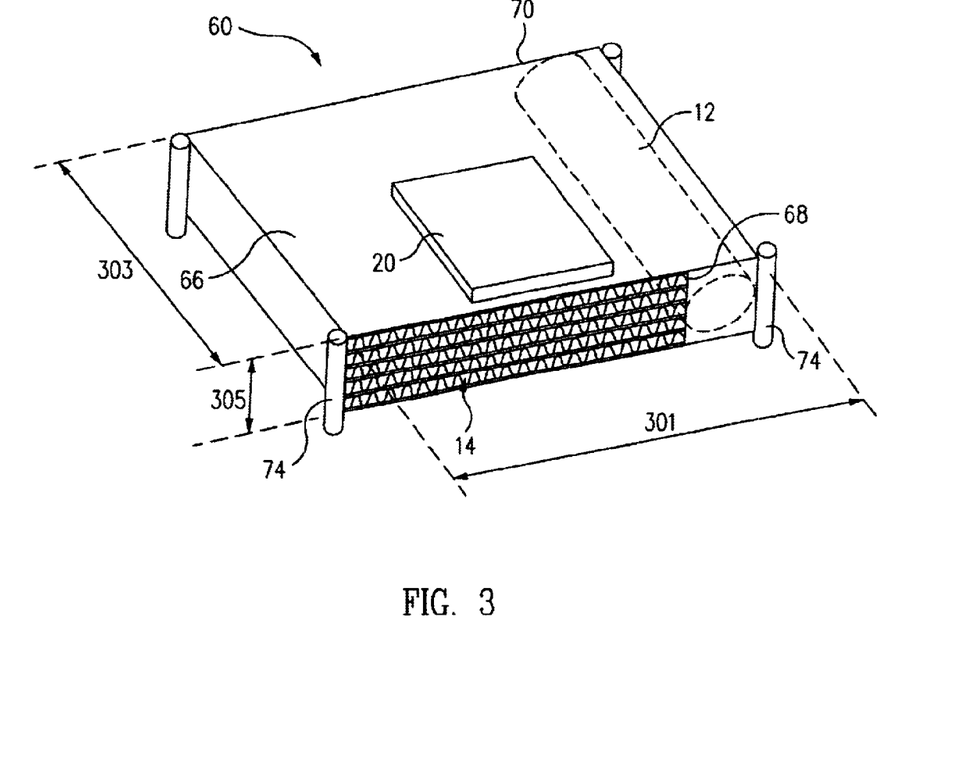
FIG. 3 is a perspective view of a field replaceable packaged refrigeration heat sink module designed according to the principles of one embodiment of the invention.
Figure 4:
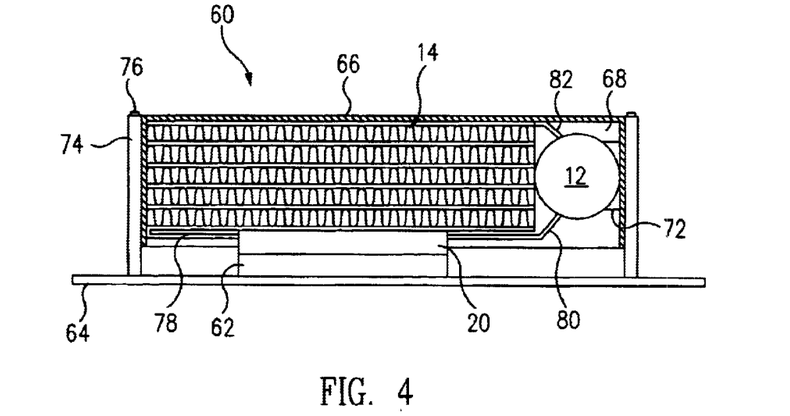
FIG. 4 is cross sectional view of the field replaceable packaged refrigeration heat sink module of FIG. 3 shown mounted on an exemplary electrical component according to the principles of one embodiment of the invention.
Figure 5:
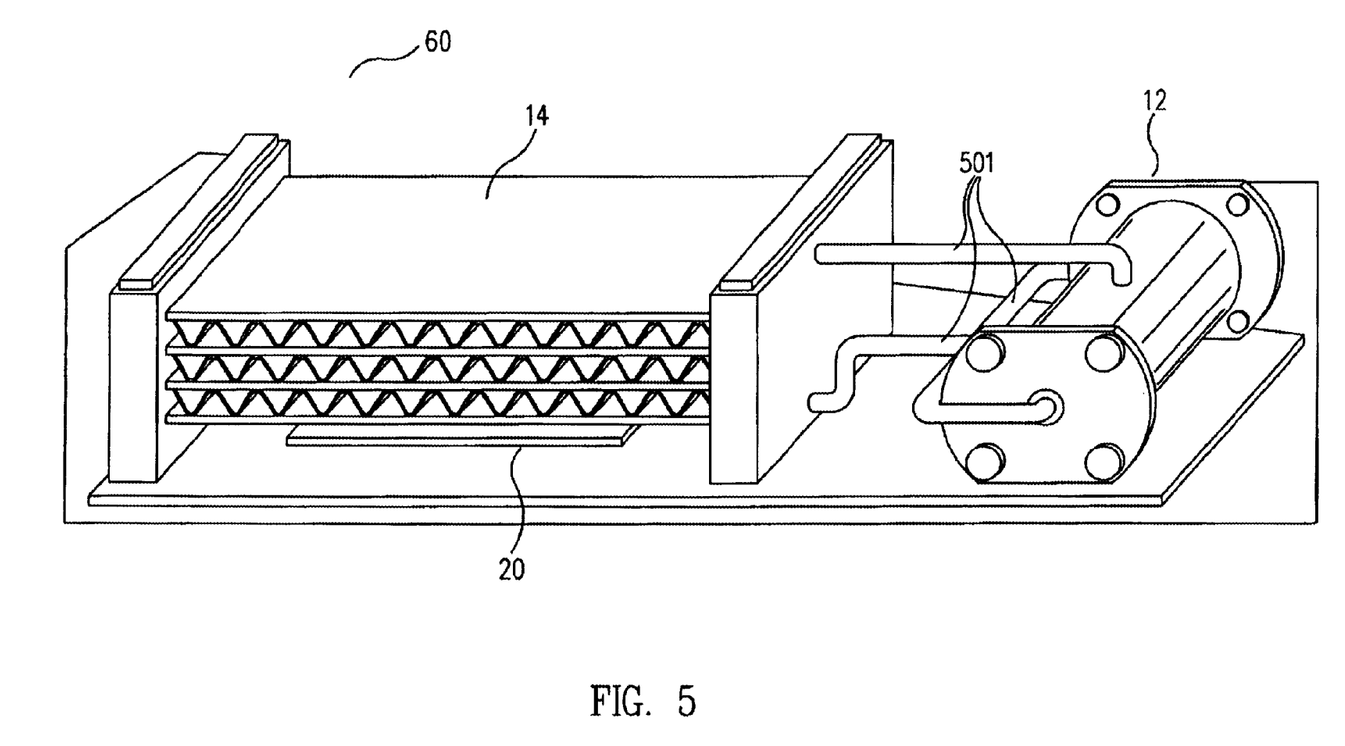
FIG. 5 is a Computer-generated representation of one embodiment of the field replaceable packaged refrigeration heat sink module of FIG. 3 according to the principles of one embodiment of the invention.

One example of a physical implementation of the functional diagram of a field replaceable packaged refrigeration heat sink module 10 of FIG. 1 is shown as field replaceable packaged refrigeration heat sink module 60 of FIG. 3, FIG. 4 and FIG. 5. As shown in FIGS. 3 and 4, according to one embodiment of the invention, field replaceable packaged refrigeration heat sink module 60 is positioned adjacent an integrated circuit 62 that is mounted on a circuit board 64. As discussed above, in accordance with one embodiment of the invention, field replaceable packaged refrigeration heat sink module 60 is sized such that, when positioned as shown in FIG. 4, field replaceable packaged refrigeration heat sink module 60 will fit within a rack unit of a conventional computer server or a telecommunications rack. In one embodiment of the invention, field replaceable packaged refrigeration heat sink module 60 has a length 301 (FIG. 3) of approximately 6 inches, a width 303 of approximately 4 inches, and a height 305 of approximately 1.70 inches. In another embodiment of the invention, field replaceable packaged refrigeration heat sink module 60 has a length 301 of approximately 7 inches, a width 303 of approximately 5 inches, and a height 305 of approximately 1.70 inches. Of course, those of skill in the art will recognize that length 301, width 303 and height 305 of field replaceable packaged refrigeration heat sink module 60 can be varied to meet the needs of specific applications.

As shown in FIG. 3, in one embodiment of the invention, field replaceable packaged refrigeration heat sink module 60 includes a housing 66 which has generally open front and back sides 68, 70, a conventional air-cooled condenser 14, which is mounted within housing 66 between open front and back sides 68, 70, a compressor 12 which is connected to housing 66 by a suitable bracket 72, and an evaporator 20 which is connected to housing 66, below condenser 14. As discussed above, in one embodiment of the invention, compressor 12 is a linear compressor driven by a drive circuit (not shown) in a manner similar to that discussed above. In one embodiment of the invention, evaporator 20 is a conventional cold plate-type evaporator that is thermally coupled to the top of integrated circuit 62 (FIG. 4) by conventional means. In one embodiment of the invention, condenser 14 is cooled by a flow of air from a system fan (not shown) that is mounted in the housing (not shown) of the server (not shown). In addition, in one embodiment of the invention, field replaceable packaged refrigeration heat sink module 60 is connected to circuit board 64 with a number of standoffs 74 and screws 76.

During the normal operation of field replaceable packaged refrigeration heat sink module 60, relatively high-pressure liquid refrigerant from compressor 12 is conveyed through a conduit 82 to condenser 14. In one embodiment of the invention, the high-pressure liquid refrigerant is cooled in condenser 14 by the flow of air from a system fan (not shown). The refrigerant is then conveyed through a capillary tube 78 to evaporator 20. The refrigerant evaporates in evaporator 20 and in the process absorbs heat from integrated circuit 62 to thereby cool integrated circuit 62 (FIG. 4). The now gaseous refrigerant is then drawn back into compressor 12 through conduit 80. This cycle is then repeated as required to produce a desired cooling effect for integrated circuit 62.

FIG. 5 is a computer-generated representation of one embodiment of field replaceable packaged refrigeration heat sink module 60 of FIG. 3 and FIG. 4 and therefore represents a computer-generated representation of a physical implementation of the functional diagram of field replaceable packaged refrigeration heat sink module 10 of FIG. 1. Shown in FIG. 5 are: condenser 14; compressor 12; evaporator 20; and tubing 501. It is worth noting that tubing 501 is relatively minimal and, is therefore, a substantial improvement over the extensive "plumbing" associated with prior art liquid-based cooling systems. Indeed, unlike prior art liquid-based cooling systems, the various parts of field replaceable packaged refrigeration heat sink module 60 of the invention, including the very minimal tubing 501, are self-contained in field replaceable packaged refrigeration heat sink module 60 and therefore a failure of any of the tubes 501 would typically not result in the introduction of liquid into or onto the electronic devices (62 in FIG. 4) and would not cause the catastrophic system failure that was the risk associated with prior art liquid-based cooling systems.

Figure 6:
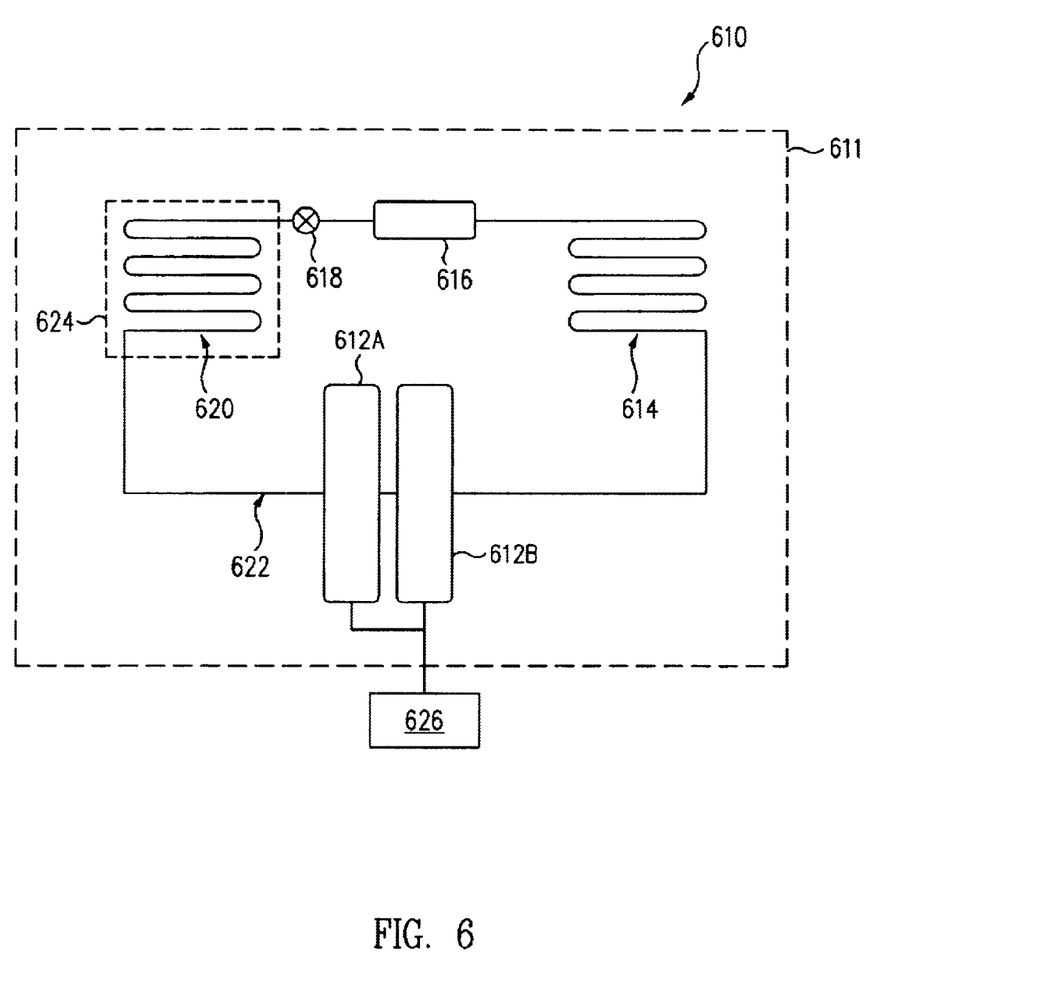
FIG. 6 is a functional diagram of a multiple compressor refrigeration heat sink module designed according to the principles of one embodiment of the invention.

In some applications, such as multi-chip module and mainframe applications, more cooling capacity is required and/or a higher degree of system reliability and efficiency is necessary. FIG. 6 is a functional diagram of a multiple compressor refrigeration heat sink module 610 designed according to one embodiment of the invention. As discussed in more detail below, multiple compressor refrigeration heat sink module 610 is ideal for applications that require more cooling capacity, better reliability and more system efficiency.

Referring to FIG. 6, multiple compressor refrigeration heat sink module 610 includes two compressors 612A and 612B, a condenser 614, an optional receiver 616, an expansion device 618, and evaporator 620, all of which are connected together in refrigeration loop 622 through which a refrigerant, such as R134A, is circulated. As also shown in FIG. 6, compressors 612A and 612B, condenser 614, optional receiver 616, expansion device 618 and evaporator 620, in refrigeration loop 622, are, in one embodiment, self-contained in multiple compressor refrigeration heat sink module 610, as indicated by dashed line 611.

In one embodiment of the invention, evaporator 620 is positioned in thermal contact with a heat source 624, such as a multi-chip module, which is to be cooled. In multi-chip module or multiple component sub-system applications, multiple compressor refrigeration heat sink module 610 typically includes multiple evaporators 620. In one embodiment, one evaporator 620 is provided for each chip in the multi-chip module or each component in the multiple component sub-system to be cooled. In other embodiments, the multi-chip module, or multiple component sub-system is treated as a heat bath and a single, or multiple, evaporators 620 is/are provided and not necessarily one evaporator 620 for each chip or component.

As is well understood by those of ordinary skill in the art, and as discussed above with respect to field replaceable packaged refrigeration heat sink modules 10 and 60, in operation of multiple compressor refrigeration heat sink module 610, compressors 612A and 612B compress the refrigerant (not shown) into a high-pressure, high temperature liquid that is then conveyed to condenser 614. At condenser 614, the refrigerant is allowed to cool before being conveyed to receiver 616. From receiver 616, the refrigerant passes through expansion device 618, which may be, for example, a capillary tube, and into evaporator 620. The liquid refrigerant evaporates in evaporator 620 and in the process absorbs heat from heat source 624 to produce the desired cooling effect. From evaporator 620, the refrigerant is drawn back into compressors 612A and 612B to begin another cycle through refrigeration loop 622.

In addition to having most of the advantages discussed above with respect to field replaceable packaged refrigeration heat sink modules 10 and 60, multiple compressor refrigeration heat sink module 610 has, by virtue of employing multiple compressors 612A and 612B, several advantages over field replaceable packaged refrigeration heat sink modules 10 and 60.

First, by employing multiple compressors 612A and 612B, refrigeration module 610 can provide more cooling capacity without resorting to a larger single compressor. Consequently, multiple compressor refrigeration heat sink module 610 is more flexible in terms of the resulting module dimensions, i.e., instead of adding a single large, and bulky, compressor that may not fit into existing housings, multiple compressor refrigeration heat sink module 610 spreads the additional cooling capability, and increased compressor area, over multiple smaller compressors 612A and 612B. Consequently, multiple compressor refrigeration heat sink module 610 can be designed to have a flexible, and smaller, footprint to fit into smaller spaces and existing system housings. Thus, there is no need to design a system with the compressor removed from the heat source. This avoids the space and plumbing complications associated with remotely located compressors that were discussed above.

Second, compressors 612A and 612B provide multiple compressor refrigeration heat sink module 610 with component redundancy and a safety backup mechanism. This is particularly advantageous in systems, such as mainframe computers, where components, such as multi-chip modules, cannot be "hot-swapped" out and the entire system must be shut down in order to remove and/or replace the faulty module. In these "cold-swap" systems, if a single compressor in the refrigeration mechanism were to fail, the entire system would have to be immediately shut down for repair/ replacement to avoid damage to the heat producing components. Clearly, this is very disruptive, if not catastrophic, to an organization utilizing the "cold-swap" system to conduct its business and/or other applications.

By employing multiple compressors 612A and 612B, multiple compressor refrigeration heat sink module 610 provides a redundancy whereby if one compressor 612A or 612B fails, the other compressor 612B or 612A can be used to keep the "cold-swap" system safely up and running until there is a convenient time to shut down the entire "cold-swap" system to make repairs. This allows the user of the "cold-swap" system critical system operational control. In one embodiment of the invention, one compressor 612A or 612B is typically on and the other compressor 612B or 612A is in standby. In this embodiment of the invention, compressor control mechanism 626 is typically a simple toggle switch (not shown) that applies power to compressor 612B or 612A in the event of failure of compressor 612A or 612B.

In other embodiments of the invention, compressors 612A or 612B time-share so that no one compressor 612A or 612B is worn out faster than the other is. In this embodiment of the invention, compressor control mechanism 626 is a simple toggle switch (not shown) connected to a timer circuit (not shown) to apply power to compressor 612A or 612B on a time-sharing basis.

Third, in one embodiment of the invention, compressors 612A and 612B provide multiple compressor refrigeration heat sink module 610 with parallel operation capability. In this embodiment of the invention, the cooling load at any given time is shared between compressors 612A and 612B. This load sharing can be on a 50/50 basis, a 75/25 basis or on any other basis dictated by the particular application. Load sharing is advantageous because it is typically easier on compressors 612A and 612B since neither compressor 612A or 612B is forced to carry the entire load.

In addition, parallel compressor operation allows for variable cooling capability. In this embodiment of the invention, compressor control mechanism 626 works to increase the cooling capacity provided by compressors 612A or 612B in response to an increase in heat generated by heat source 624. Consequently, in this embodiment of the invention, compressors 612A and 612B provide multiple compressor refrigeration heat sink module 610 with the capability to respond to an increase in microprocessor activity or ambient system temperature. This is a distinct improvement over single compressor systems that were designed to simply continuously run at a level that would provide cooling for a "worst-case" heat load, regardless of the actually heat load and the actual cooling required. Consequently, multiple compressor refrigeration heat sink module 610 can provide adequate cooling, but avoid overcooling and the problems associated with overcooling such as condensation, excessive power use, and unnecessary component wear and tear.

As discussed above, embodiments of multiple compressor refrigeration heat sink module 610, designed, according to the invention, for parallel compressor operation and variable cooling capability, require that compressor control mechanism 626 increase the cooling capacity provided by compressors 612A or 612B in response to an increase in heat generated by heat source 624, or an increase in system temperature. This can be accomplished by several cooling capacity control mechanisms well known in the art of refrigeration such as: a hot gas bypass mechanism; an evaporator driven pressure regulator mechanism; a suction gas throttling mechanism; or any other mechanical or electronic cooling capacity control scheme or mechanism, now know in the art or developed at a latter date. As noted above, these cooling capacity control schemes and mechanisms, and their operation, are well know to those of skill in the art. Consequently, the structure and operation of these systems is not shown or discussed herein to avoid detracting from the invention.

Hot gas bypass mechanisms, evaporator driven pressure regulator mechanisms, and suction gas throttling mechanisms, and most other mechanical cooling capacity control schemes or mechanisms, have the advantage of increased reliability since these systems typically do not require electronics and have minimal, or no, moving parts to wear out or otherwise fail. Consequently, embodiments of multiple compressor refrigeration heat sink module 610 using these cooling control schemes are particularly robust and low maintenance.

In accordance with a particular embodiment of the present invention shown in FIG. 6, compressors 612A and 612B, like compressor 12 in FIG. 1, are one of several new generation compressors that are relatively small, on the order of 2.0 inches in diameter and 3 to 4 inches long. In one embodiment of the invention, compressors 612A and 612B are less than 1.7 inches in diameter and less than 4 inches long. As discussed above, one example of this new generation of compressors is the relatively new linear compressor, now being used in the more standard refrigeration, i.e., non-electronics, industry. As discussed in more detail above, in one embodiment of the invention, compressors 612A and 612B are linear compressors whose operation is controlled by compressor control mechanism 626.

As also discussed above, like linear compressor 12 in FIG. 1, the linear compressors suitable for use as compressors 612A and 612B in multiple compressor refrigeration heat sink module 610 can be any of a variety of single, double, or multiple-piston linear compressors that are known in the art. For example, in one embodiment of the invention, linear compressors 612A and 612B are single-piston linear compressors of the type disclosed in U.S. Pat. No. 5,993,178, which is hereby incorporated herein by reference, or double-piston linear compressors of the type disclosed in U.S. Pat. No. 6,089,836 or U.S. Pat. No.

6,398,523, both of which are also hereby incorporated herein by reference.

As discussed above, linear compressors, unlike prior art liquid-based cooling systems with compressors that used large amounts of oil for compressor operation, use little or no oil in operation. This is a significant advantage since, as discussed above, in the electronics industry, the use of oil is problematic in terms of system operation, maintenance, potential leaks and weight.

As also discussed above, while a specific embodiment of a multiple compressor refrigeration heat sink module 610 is discussed herein that includes exemplary linear compressors, those of skill in the art will recognize that the choice of linear compressors, or any particular compressors, for use as compressors 612A and 612B in the discussion above was made for illustration simplicity and to avoid detracting from the invention by describing multiple specific embodiments at one time. In other embodiments of the invention appropriately sized rotary compressors, or other type of compressors, can be used as compressors 612A and 612B. For instance, in various embodiments of the invention, compressors 612A and 612B can be: reciprocating compressors; swash-plate compressors; rolling piston compressors; scroll compressors; rotary vane compressors; screw compressors; aerodynamic-turbo compressors; aerodynamic-axial compressors; or any other reciprocating, volumetric or aerodynamic compressors known in the art, or developed after this application is filed. In addition, compressors 612A and 612B do not need to be identical compressor types and the examples of compressors listed above can be used as either one of compressor 612A, compressor 612B, or as both compressors 612A and 612B. Consequently, the present invention should not be read as being limited to the particular embodiments discussed above using linear, or any specific, compressor types.

Figure 7:
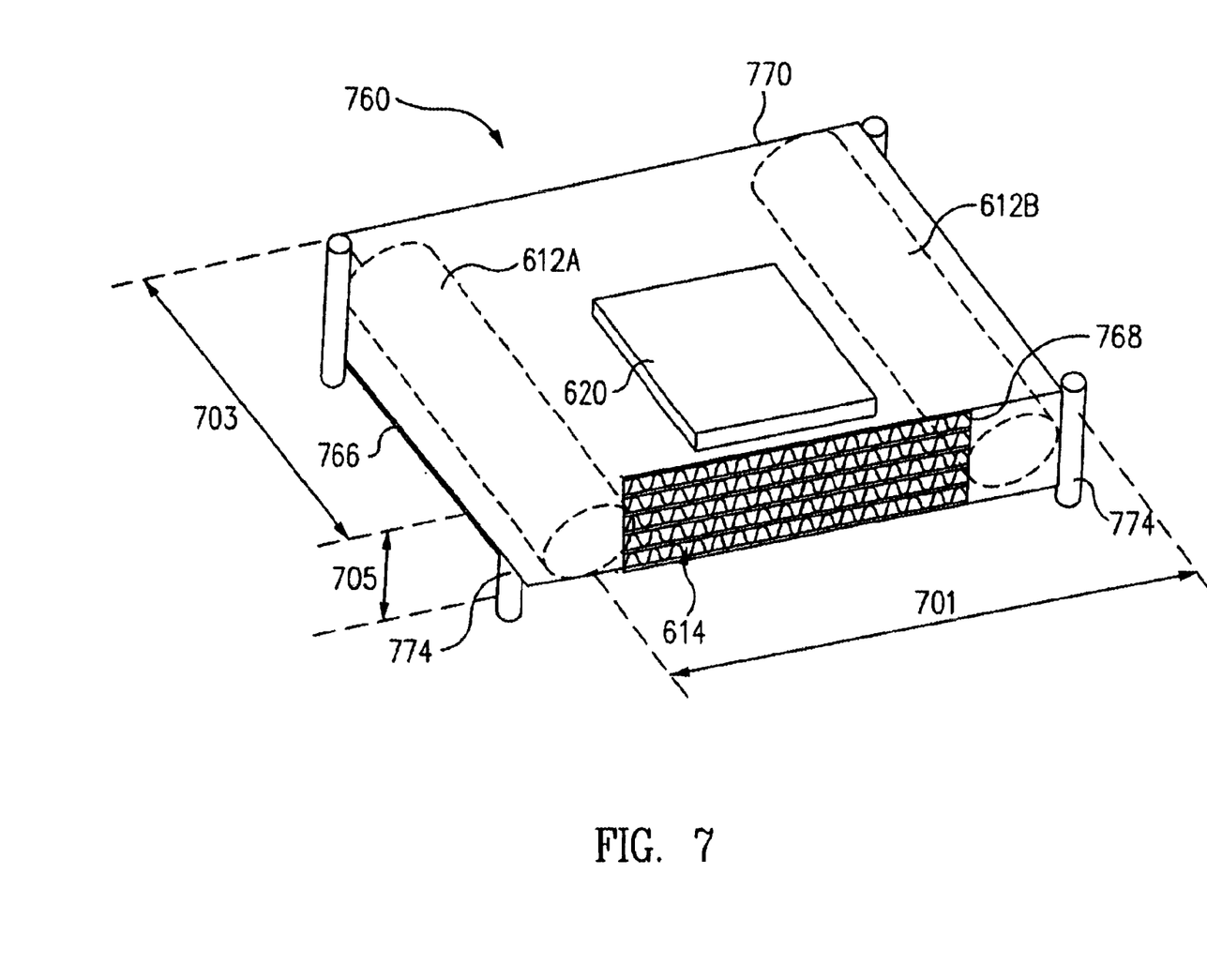
FIG. 7 is a perspective view of a multiple compressor refrigeration heat sink module designed according to the principles of one embodiment of the invention.
Figure 8:
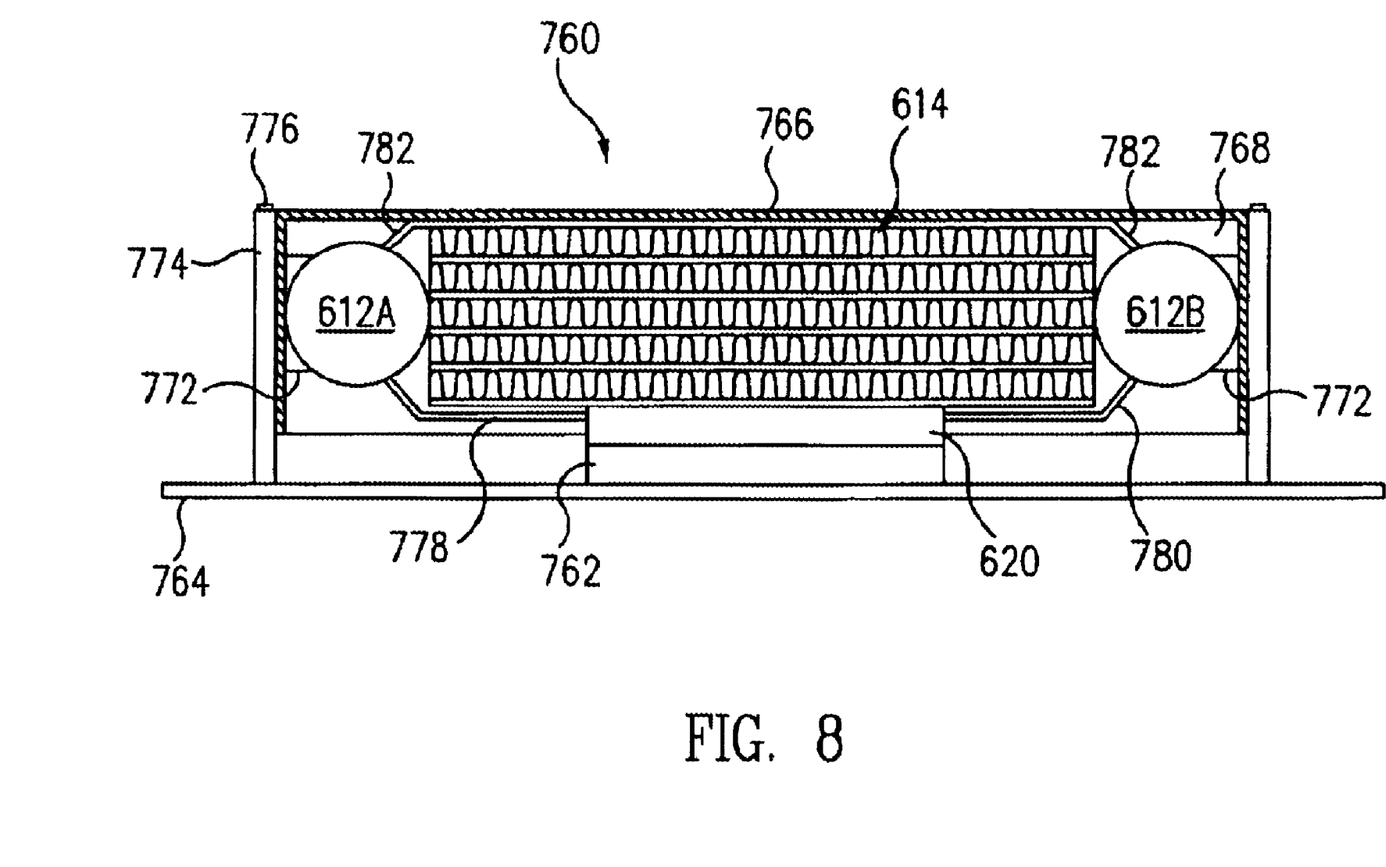
FIG. 8 is a cross sectional view of the multiple compressor refrigeration heat sink module of FIG. 7 shown mounted on a multi-chip module according to the principles of one embodiment of the invention.

One example of a physical implementation of the functional diagram of a multiple compressor refrigeration heat sink module 610 of FIG. 6 is shown as multiple compressor refrigeration heat sink module 760 of FIG. 7 and FIG. 8. As shown in FIGS. 7 and 8, according to one embodiment of the invention, multiple compressor refrigeration heat sink module 760 is positioned adjacent a multi-chip module 762 (FIG. 8) that is mounted on a circuit board 764. As discussed above, in accordance with one embodiment of the invention, multiple compressor refrigeration heat sink module 760 is sized such that, when positioned as shown in FIG. 8, multiple compressor refrigeration heat sink module 760 will fit within the housing of a conventional mainframe computer system. In one embodiment of the invention, multiple compressor refrigeration heat sink module 760 has a length 701 (FIG. 7) of approximately 6 inches, a width 703 of approximately 4 inches, and a height 705 of approximately 1.70 inches. In another embodiment of the invention, multiple compressor refrigeration heat sink module 760 has a length 701 (FIG. 7) of approximately 7 inches, a width 703 of approximately 5 inches, and a height 705 of approximately 1.70 inches. Of course, those of skill in the art will recognize that length 701, width 703 and height 705 of multiple compressor refrigeration heat sink module 760 can be varied to meet the needs of specific applications.

As shown in FIG. 7 and FIG. 8, in one embodiment of the invention, multiple compressor refrigeration heat sink module 760 includes a housing 766 which has generally open front and back sides 768, 770, a conventional air-cooled condenser 614, which is mounted within housing 766 between open front and back sides 768,770, compressors 612A and 612B which are connected to housing 766 by a suitable bracket 772, and an evaporator 620 which is connected to housing 766, below condenser 614.

As discussed above, in multi-chip module, or multiple component sub-system, applications of multiple compressor refrigeration heat sink module 760, multiple compressor refrigeration heat sink module 760 typically includes multiple evaporators 620. In one embodiment, one evaporator 620 is provided for each chip (not shown) in multi-chip module 762, or component in a multiple component sub-system, to be cooled. In other embodiments, multi-chip module 762, or multiple component sub-system, is treated as a heat bath and a single, or multiple, evaporators 620 is/are provided, however, not necessarily one evaporator 620 for each chip or component.

As discussed above, in one embodiment of the invention, compressors 612A and 612B are linear compressors controlled by a compressor control mechanism, such as compressor control mechanism 626 in FIG. 6 (not shown in FIGS. 7, 8 and 9), in a manner similar to that discussed above. In one embodiment of the invention, evaporator 620 is a conventional cold plate-type evaporator that is thermally coupled to the top of multi-chip module 762 (FIG. 8) by conventional means. In one embodiment of the invention, condenser 614 is cooled by a flow of air from a system fan (not shown) that is mounted in the housing (not shown) of the parent system (not shown). In addition, in one embodiment of the invention, multiple compressor refrigeration heat sink module 760 is connected to circuit board 764 with a number of standoffs 774 and screws 776.

As discussed above, during the normal operation of multiple compressor refrigeration heat sink module 760, relatively high-pressure liquid refrigerant from compressors 612A and 612B is conveyed through a conduit 782 to condenser 614. In one embodiment of the invention, the high-pressure liquid refrigerant is cooled in condenser 614 by the flow of air from a system fan (not shown). The refrigerant is then conveyed through a capillary tube 778 to evaporator 620. The refrigerant evaporates in evaporator 620 and in the process absorbs heat from multi-chip module 762 to thereby cool multi-chip module 762 (FIG. 8). The now gaseous refrigerant is then drawn back into compressors 612A and 612B through conduit 780. This cycle is then repeated as required to produce a desired cooling effect for multi-chip module 762.

Figure 9:
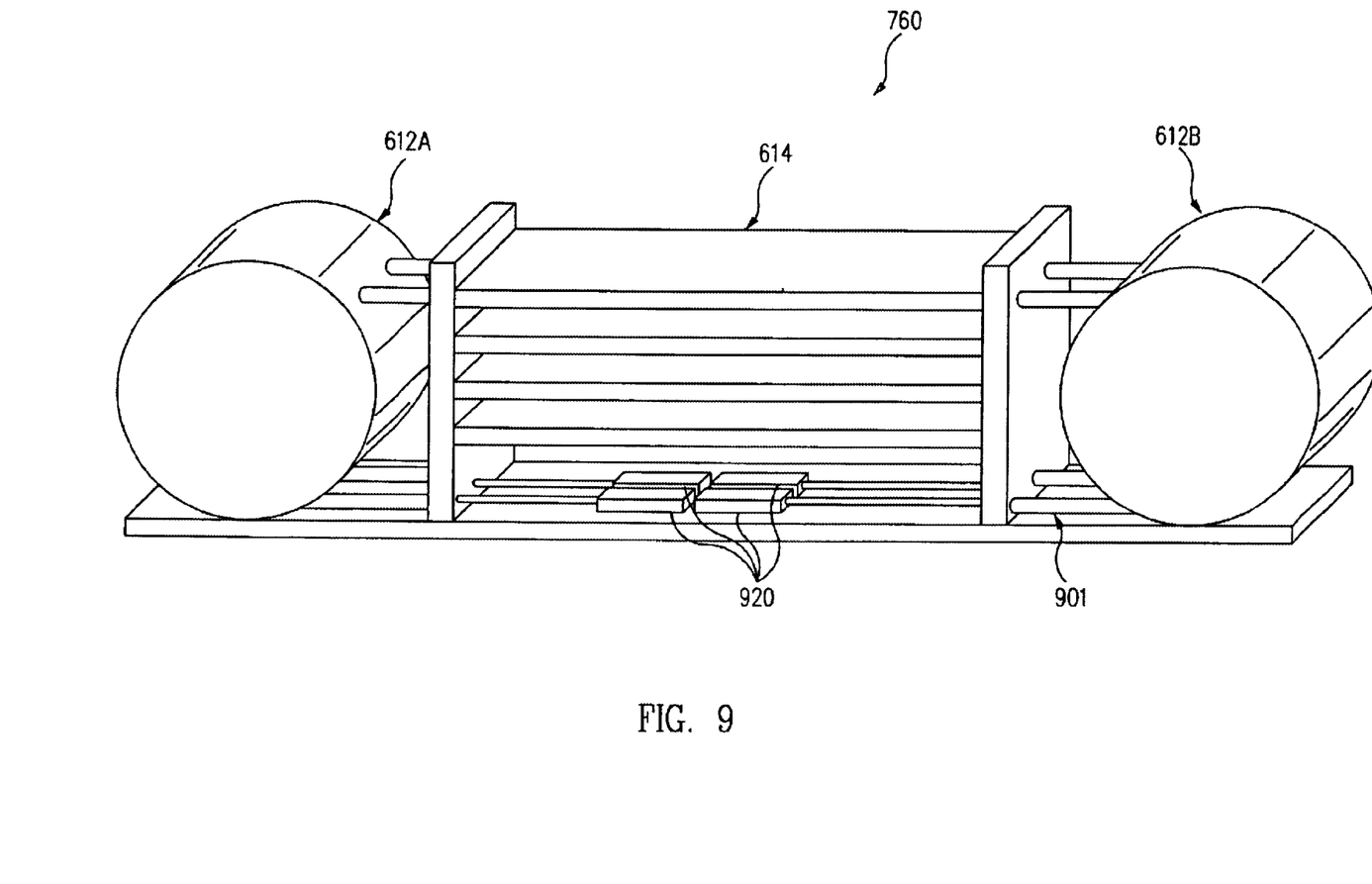
FIG. 9 is a computer-generated representation of one embodiment of the field replaceable packaged refrigeration heat sink module of FIG. 7 according to the principles of one embodiment of the invention.

FIG. 9 is a computer-generated representation of one embodiment of multiple compressor refrigeration heat sink module 760 of FIG. 7 and FIG. 8, including multiple evaporators 920, and therefore represents a computer-generated representation of a physical implementation of the functional diagram of multiple compressor refrigeration heat sink module 610 of FIG. 6. Shown in FIG. 9 are: condenser 614; compressors 612A and 612B; quad evaporators 920; and tubing 901. It is worth noting that tubing 901 is relatively minimal and, is therefore, a substantial improvement over the extensive "plumbing" associated with prior art liquid-based cooling systems. Indeed, in one embodiment of the invention, unlike prior art liquid-based the parts cooling various of multiple compressor refrigeration heat sink module 760 of the invention, including the very minimal tubing 901, are self-contained in multiple compressor refrigeration heat sink module 760 and therefore a failure of any of the tubes 901 would typically not result in the introduction of liquid into, or onto, the multi-chip module (762 in FIG. 8), or the parent system (not shown), and would therefore typically not cause the catastrophic system failure that was the risk associated with prior art liquid-based cooling system.

As discussed above, the present invention is directed to a multiple compressor refrigeration heat sink module that is suitable for use in standard electronic component environments. The present invention takes advantage of recent advances in compressor technology to provide a compact and reliable multiple compressor refrigeration heat sink module. In one embodiment, the multiple compressor refrigeration heat sink module of the present invention is self-contained and is specifically designed to have physical dimensions similar to those of a standard air-based cooling system, such as a finned heat sink or heat pipe. As a result, the present invention can be utilized in existing electronic systems without the need for housing modifications or the "plumbing" associated with prior art liquid-based cooling systems. Indeed, unlike prior art liquid-based cooling systems, the various parts of the multiple compressor refrigeration heat sink module of the invention, including the minimal tubing, are self-contained in the multiple compressor refrigeration heat sink module. Therefore, a failure of any of the tubes would typically not result in the introduction of liquid into, or onto, the electronic devices being cooled.

In addition, like prior art air-based cooling systems, the multiple compressor refrigeration heat sink module of the invention is compact and simple in both operation and installation, with minimal parts to fail or break and minimal added complexity. Therefore, unlike prior art liquid-based cooling systems, the multiple compressor refrigeration heat sink module of the invention is very sturdy and very reliable.

In addition, the multiple compressor refrigeration heat sink module of the present invention is specifically designed to be operational in any orientation. Consequently, unlike prior art liquid-based cooling systems, the multiple compressor refrigeration heat sink module of the present invention can be mounted, and operated, at any angle. This makes the multiple compressor refrigeration heat sink module of the present invention particularly well suited for use with electronic systems.

In addition, by employing multiple compressors, the multiple compressor refrigeration heat sink module of the invention can provide more cooling capacity without resorting to a larger single compressor. Consequently, multiple compressor refrigeration heat sink modules of the invention are more flexible in terms of the resulting module dimensions. Consequently, the multiple compressor refrigeration heat sink modules of the invention have a flexible, and smaller, footprint to fit into smaller spaces and existing system housings. Thus, using the multiple compressor refrigeration heat sink modules of the invention, there is no need to design a system with the compressor removed from the heat source. This avoids the space and plumbing complications associated with remote compressors.

In addition, multiple compressors provide the multiple compressor refrigeration heat sink modules of the invention with component redundancy and a safety backup mechanism. This is particularly advantageous in systems, such as mainframe computers, where components, such as multi-chip modules, cannot be "hot-swapped" out and the entire system must be shut down in order to remove and/or replace the faulty module. By employing multiple compressors, the multiple compressor refrigeration heat sink modules of the invention provide a redundancy whereby if one compressor fails, the other compressor can be used to keep the "cold-swap" system safely up and running until a convenient time is found to shut down the entire "cold-swap" system to make repairs.

In one embodiment of the invention, one compressor is typically on and the other compressor is in standby. In this embodiment of the invention, a compressor control mechanism is typically a simple toggle switch that applies power to the operational "standby" compressor in the event of failure of the main compressor. In other embodiments of the invention, the multiple compressors time-share so that no one compressor is worn out faster than the other. In this embodiment of the invention, the compressor control mechanism is a simple toggle switch connected to a timer circuit to apply power to the compressors on a time-sharing basis.

In addition, as discussed above, in one embodiment of the invention, multiple compressors provide the multiple compressor refrigeration heat sink modules of the invention with parallel operation capability. In this embodiment of the invention, the cooling load at any given time is shared between compressors. Load sharing is advantageous because it is typically easier on the compressors, since no single compressor is forced to carry the entire load.

In addition, parallel operation allows for variable cooling capability. In this embodiment of the invention, the compressor control mechanism works to increase the cooling capacity provided by compressors of the multiple compressor refrigeration heat sink modules of the invention in response to an increase in heat generated by the heat source. Consequently, the multiple compressor refrigeration heat sink modules of the invention have the capability to respond to an increase in microprocessor activity or ambient system temperature. This is a distinct improvement over single compressor systems that were designed to simply continuously run at a level that would provide cooling for a "worst-case" heat load, regardless of the actually heat load and the actual cooling required. Consequently, the multiple compressor refrigeration heat sink modules of the invention can provide adequate cooling, but avoid overcooling and the problems associated with overcooling such as condensation, excessive power use, and unnecessary component wear and tear.

In one embodiment of the invention, the variable cooling capability is accomplished by any one of several capacity control mechanisms well known in the art of refrigeration such as: a hot gas bypass mechanism; an evaporator driven pressure regulator mechanism; or a suction gas throttling mechanism. Hot gas bypass mechanisms, evaporator driven pressure regulator mechanisms, suction gas throttling mechanisms, and most other mechanical cooling capacity control schemes or mechanisms, have the advantage of increased reliability since these systems typically do not require electronics and have minimal, or no, moving parts to wear out or otherwise fail. Consequently, embodiments of the multiple compressor refrigeration heat sink modules of the invention using these cooling control schemes are particularly robust and low maintenance.

As a result of the features of the present invention discussed in detail above, the multiple compressor refrigeration heat sink module of the present invention can meet the cooling needs of multi-chip module and main frame systems, as well as other high heat producing systems, and can make further speed and device density improvements in microprocessor design a workable possibility.

It should be recognized that, while the present invention has been described in relation to the specific embodiments discussed above, those skilled in the art may develop a wide variation of structural and operational details without departing from the principles of the invention.

As one example, the choice of a linear compressor, or any particular linear compressor, for use as compressors 612A and 612B in the discussion above was made for illustration simplicity and to avoid detracting from the invention by describing multiple specific embodiments at one time. In other embodiments of the invention, appropriately sized rotary compressors, or other compressors, can be used as compressors 612A and 612B. For instance, in various embodiments of the invention, compressors 612A and 612B can be: reciprocating compressors; swash-plate compressors; rolling piston compressors; scroll compressors; rotary vane compressors; screw compressors; aerodynamic-turbo compressors; aerodynamic-axial compressors; or any other reciprocating, volumetric or aerodynamic compressors known in the art, or developed at a later date. In addition, compressors 612A and 612B do not need to be identical compressor types and the examples of compressors listed above can be used as either one of compressor 612A or compressor 612B, or as both compressors 612A and 612B. Consequently, the present invention should not be read as being limited to the particular embodiments discussed above using linear, or any specific, compressor types.

As another example, specific dimensions were discussed above as examples of possible values for length 701, width 703 and height 705 of multiple compressor refrigeration heat sink module 760. Those of skill in the art will recognize that length 701, width 703, and height 705 of multiple compressor refrigeration heat sink module 760 can be varied for specific applications and that the present invention should not be read as being limited to the particular embodiments discussed above with the particular dimensions discussed by way of illustration.

In addition, as another example, while the specific embodiments of the multiple compressor refrigeration heat sink modules of the invention discussed above had only two compressors, 612A and 612B, those of skill in the art will recognize that more than two compressors can be utilized in the multiple compressor refrigeration heat sink modules of the invention and that three or more compressors can be employed to operate in the multiple compressor refrigeration heat sink modules of the invention in a manner substantially identical to operation of the two compressor multiple compressor refrigeration heat sink modules of the invention discussed above. Consequently, the present invention should not be read as being limited to the particular embodiments discussed above using only two compressors.

What is claimed is:

1. A multiple compressor refrigeration heat sink module for cooling electronic components, said multiple compressor refrigeration heat sink module comprising:
   a multiple compressor refrigeration heat sink module housing;
   refrigerant;
   at least two compressors;
   a condenser;
   an expansion device; and
   at least one evaporator; wherein,
      said at least two compressors, said condenser, said expansion device and said at least one evaporator are coupled together in a refrigeration loop within said multiple compressor refrigeration heat sink module housing and said refrigerant is contained within said refrigeration loop such that said multiple compressor refrigeration heat sink module is a self-contained module.

2. The multiple compressor refrigeration heat sink module of claim 1; wherein,
   said multiple compressor refrigeration heat sink module has a width of approximately 5 inches, a length of approximately 7 inches and a height of approximately 1.7 inches.

3. The multiple compressor refrigeration heat sink module of claim 1; wherein, at least one of said at least two compressors is a single piston linear compressor.

4. The multiple compressor refrigeration heat sink module of claim 1; wherein, at least one of said at least two compressors is a dual-piston linear compressor.

5. The multiple compressor refrigeration heat sink module of claim 1; wherein, at least one of said at least two compressors is a multi-piston linear compressor.

6. The multiple compressor refrigeration heat sink module of claim 1; wherein, at least one of said at least two compressors is a rotary compressor.

7. The multiple compressor refrigeration heat sink module of claim 1; wherein, at least one of said at least two compressors is a reciprocating compressor.

8. The multiple compressor refrigeration heat sink module of claim 1; wherein, at least one of said at least two compressors is a rolling piston compressor.

9. The multiple compressor refrigeration heat sink module of claim 1; wherein, at least one of said at least two compressors is a rotary vane compressor.

10. The multiple compressor refrigeration heat sink module of claim 1; wherein, at least one of said at least two compressors is a screw compressor.

11. The multiple compressor refrigeration heat sink module of claim 1; wherein, at least one of said at least two compressors is a swash-plate compressor.

12. The multiple compressor refrigeration heat sink module of claim 1; wherein, at least one of said at least two compressors is a scroll compressor.

13. A computer system sub-system, said computer system sub-system comprising:
   at least one electronic component; and
   a multiple compressor refrigeration heat sink module for cooling said electronic component, said multiple compressor refrigeration heat sink module comprising:
      a multiple compressor refrigeration heat sink module housing;
      refrigerant;
      at least two compressors;
      a condenser;
      an expansion device; and
      at least one evaporator; wherein,
         said at least two compressors, said condenser, said expansion device and said at least one evaporator are coupled together in a refrigeration loop within said multiple compressor refrigeration heat sink module housing and said refrigerant is contained within said refrigeration loop such that said multiple compressor refrigeration heat sink module is a self-contained module; further wherein,
            said multiple compressor refrigeration heat sink module is mounted directly over a first surface of said electronic component.

14. The computer system sub-system of claim 13; wherein, said multiple compressor refrigeration heat sink module has a width of approximately 5 inches, a length of approximately 7 inches and a height of approximately 1.7 inches.

15. The computer system sub-system of claim 13; wherein, at least one of said at least two compressors is a single piston linear compressor.

16. The computer system sub-system of claim 13; wherein, at least one of said at least two compressors is a dual-piston linear compressor.

17. The computer system sub-system of claim 13; wherein, at least one of said at least two compressors is a multi-piston linear compressor.

18. The computer system sub-system of claim 13; wherein, at least one of said at least two compressors is a rotary compressor.

19. The computer system sub-system of claim 13; wherein, at least one of said at least two compressors is a reciprocating compressor.

20. The computer system sub-system of claim 13; wherein, at least one of said at least two compressors is a rolling piston compressor.

21. The computer system sub-system of claim 13; wherein, at least one of said at least two compressors is a rotary vane compressor.

22. The computer system sub-system of claim 13; wherein, at least one of said at least two compressors is a screw compressor.

23. The computer system sub-system of claim 13; wherein, at least one of said at least two compressors is a swash-plate compressor.

24. The computer system sub-system of claim 13; wherein, at least one of said at least two compressors is a scroll compressor.

25. The computer system sub-system of claim 13; wherein, said electronic component is a multi-chip module.

26. The computer system sub-system of claim 13; wherein, said electronic component is a multiple component subsystem.

27. An electronic system, said electronic system comprising:
    at least one electronic component; and
    a multiple compressor refrigeration heat sink module for cooling said electronic component, said multiple compressor refrigeration heat sink module comprising:
        a multiple compressor refrigeration heat sink module housing;
        refrigerant;
        at least two compressors;
        a condenser;
        an expansion device; and
        at least one evaporator; wherein,
            said at least two compressors, said condenser, said expansion device and said at least one evaporator are coupled together in a refrigeration loop within said multiple compressor refrigeration heat sink module housing and said refrigerant is contained within said refrigeration loop such that said multiple compressor refrigeration heat sink module is a self-contained module.

28. The electronic system of claim 27; wherein, said multiple compressor refrigeration heat sink module has a width of approximately 5 inches, a length of approximately 7 inches and a height of approximately 1.7 inches.

29. The electronic system of claim 27; wherein, at least one of said at least two compressors is a single piston linear compressor.

30. The electronic system of claim 27; wherein, at least one of said at least two compressors is a dual-piston linear compressor.

31. The electronic system of claim 27; wherein, at least one of said at least two compressors is a multi-piston linear compressor.

32. The electronic system of claim 27; wherein, at least one of said at least two compressors is a rotary compressor.

33. The electronic system of claim 27; wherein, at least one of said at least two compressors is a reciprocating compressor.

34. The electronic system of claim 27; wherein, at least one of said at least two compressors is a rolling piston compressor.

35. The electronic system of claim 27; wherein, at least one of said at least two compressors is a rotary vane compressor.

36. The electronic system of claim 27; wherein, at least one of said at least two compressors is a screw compressor.

37. The electronic system of claim 27; wherein, at least one of said at least two compressors is a swash-plate compressor.

38. The electronic system of claim 27; wherein, at least one of said at least two compressors is a scroll compressor.

39. The electronic system of claim 27; wherein, said electronic component is a multi-chip module.

40. The electronic system of claim 27; said electronic component is a multiple component sub-system.

41. The electronic system of claim 27; wherein, said electronic system is a mainframe computer.

* * * * *